(12) United States Patent
Nakabayashi et al.

(10) Patent No.: US 9,680,071 B2
(45) Date of Patent: *Jun. 13, 2017

(54) LIGHT EMITTING DEVICE HAVING SUBSTRATE INCLUDING HEAT DISSIPATION TERMINALS

(71) Applicant: NICHIA CORPORATION, Anan-shi, Tokushima (JP)

(72) Inventors: Takuya Nakabayashi, Tokushima (JP); Akira Hori, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/219,627

(22) Filed: Jul. 26, 2016

(65) Prior Publication Data

US 2016/0336494 A1   Nov. 17, 2016

Related U.S. Application Data

(63) Continuation of application No. 14/716,670, filed on May 19, 2015, now Pat. No. 9,406,852.

(30) Foreign Application Priority Data

May 21, 2014 (JP) .................. 2014-105728
Apr. 16, 2015 (JP) .................. 2015-084046

(51) Int. Cl.
*H01L 33/48* (2010.01)
*H01L 33/54* (2010.01)
(Continued)

(52) U.S. Cl.
CPC ............ *H01L 33/54* (2013.01); *H01L 33/486* (2013.01); *H01L 33/502* (2013.01); *H01L 33/56* (2013.01);
(Continued)

(58) Field of Classification Search
CPC ....... H01L 33/48; H01L 33/486; H01L 33/50; H01L 33/62
See application file for complete search history.

(56) References Cited

U.S. PATENT DOCUMENTS 5,942,770 A   8/1999  Ishinaga et al.
6,093,940 A   7/2000  Ishinaga et al.
(Continued)

FOREIGN PATENT DOCUMENTS

EP   2597678 A2   5/2013
JP   H10-290029 A   10/1998
(Continued)

OTHER PUBLICATIONS

Extended European Search Report of the corresponding European Patent Application No. 15168538.5, dated Dec. 21, 2015.

*Primary Examiner* — Hoai V Pham
(74) *Attorney, Agent, or Firm* — Global IP Counselors, LLP

(57) ABSTRACT

A light emitting device includes a substrate having a first main surface that serves as the light extraction surface, a second main surface that is opposite the first main surface, and a mounting surface that is adjacent to at least the second main surface, and that is provided an insulating base material, a pair of connection terminals disposed on the second main surface, and a heat dissipation terminal disposed on the second main surface and between the pair of connection terminals; a light emitting element that is mounted on the first main surface of the substrate and; a sealing member that seals the light emitting element and is formed substantially in the same plane as the substrate on the mounting surface.

21 Claims, 14 Drawing Sheets

(51) Int. Cl.
   *H01L 33/50*    (2010.01)
   *H01L 33/64*    (2010.01)
   *H01L 33/62*    (2010.01)
   *H01L 33/56*    (2010.01)
   *H01L 25/075*   (2006.01)

(52) U.S. Cl.
   CPC ............ *H01L 33/62* (2013.01); *H01L 33/642* (2013.01); *H01L 33/647* (2013.01); *H01L 25/0753* (2013.01); *H01L 2224/16225* (2013.01)

(56) References Cited

U.S. PATENT DOCUMENTS

| | | | |
|---|---|---|---|
| 9,406,852 B2* | 8/2016 | Nakabayashi | H01L 33/486 |
| 2008/0036362 A1 | 2/2008 | Tanimoto et al. | |
| 2011/0051039 A1 | 3/2011 | Okamoto et al. | |
| 2012/0261689 A1 | 10/2012 | Appelt et al. | |
| 2013/0037847 A1 | 2/2013 | Sugiura et al. | |
| 2013/0126916 A1 | 5/2013 | Arai et al. | |
| 2015/0021642 A1 | 1/2015 | Nakabayashi | |
| 2015/0129902 A1 | 5/2015 | Iino | |
| 2015/0171281 A1 | 6/2015 | Nakabayashi et al. | |
| 2015/0235919 A1 | 8/2015 | Sabathil et al. | |

FOREIGN PATENT DOCUMENTS

| | | |
|---|---|---|
| JP | 2001-352105 A | 12/2001 |
| JP | 2006-093565 A | 4/2006 |
| JP | 2008-521210 A | 6/2008 |
| JP | 2009-188005 A | 8/2009 |
| JP | 2010-003942 A | 1/2010 |
| JP | 2010-157638 A | 7/2010 |
| JP | 2013-041865 A | 2/2013 |
| JP | 2013-110199 A | 6/2013 |
| JP | 2014-107307 A | 6/2014 |
| WO | 2014-016165 A1 | 1/2014 |

* cited by examiner

LIGHT EMITTING DEVICE HAVING SUBSTRATE INCLUDING HEAT DISSIPATION TERMINALS

CROSS-REFERENCE TO RELATED APPLICATIONS

This application is a continuation application of U.S. patent application Ser. No. 14/716,670, filed on May 19, 2015. This application claims priority to Japanese Patent Application No. 2014-105728 filed on May 21, 2014 and Japanese Patent Application No. 2015-084046 filed on Apr. 16, 2015. The entire disclosures of U.S. patent application Ser. No. 14/716,670 and Japanese Patent Application Nos. 2014-105728 and 2015-084046 are hereby incorporated herein by reference.

BACKGROUND

Technical Field

The present disclosure relates to a light emitting device.

Related Art

Many different light sources have been used in electronic devices. For instance, compact, thin light emitting devices have been used as backlight light sources in the display panels and the like of electronic devices. A small (approximately chip scale) light emitting devices are proposed (for example, JP2008-521210A).

Because a light emitting device such as this is compact, it may have poor heat dissipation. Also, in the case where a compact light emitting device such as this is used as a side-mount type of light emitting device, it is important to control stability or mounting position accuracy (hereinafter referred to as mountability) in secondary mounting onto a mounting board with solder.

SUMMARY

A light emitting device according to one aspect of the present invention include a substrate having a first main surface, a second main surface that is opposite the first main surface, and a mounting surface that is adjacent to at least the second main surface, and that includes an insulating base material, a pair of connection terminals disposed on the second main surface, a solder resist disposed on the second main surface, a metal film disposed on the second main surface, at least part of the metal film being covered by the solder resist such that an exposed part of the metal film is defined and serves as a heat dissipation terminal between the pair of connection terminals, a light emitting element that is mounted on the first main surface of the substrate in flip-chip manner and, a light blocking sealing member that seals the light emitting element and is formed substantially in the same plane as the substrate on the mounting surface.

DETAILED DESCRIPTION

Figure 1A:
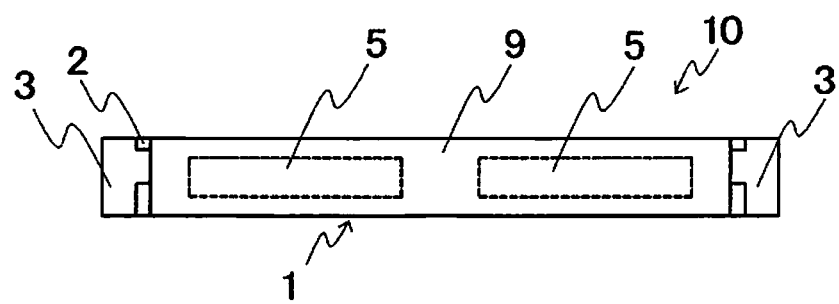
FIGS. 1A to 1D show an embodiment of the light emitting device of the present invention, with FIG. 1A being a simplified front view, FIG. 1B a simplified rear view, FIG. 1C a simplified bottom view, and FIG. 1D a simplified side view.

Hereinafter, embodiments of the present invention will be described with reference to the drawings as appropriate. It is to be noted that the light emitting device described below is intended for implementing the technical concept of the present invention, and the present invention is not limited to those described below unless otherwise specified. Matters described in one embodiment and example are applicable to other embodiments and examples. The size, positional relationship and so on of members shown in the drawings may be exaggerated for clarifying the descriptions.

In this description, a light extraction surface of the light emitting device is referred to as an upper surface, and a surface neighboring or intersecting the light extraction surface is referred to as a side surface, and one of the side surfaces is referred to as a mounting surface of the light emitting device. Also, among the surfaces of elements or members that form the light emitting device, a surface corresponding to the light extraction surface of the light emitting device may be referred to as a first main surface or upper surface or front surface, a surface opposite to the first main surface may be referred to as a second main surface or lower surface or rear surface, and a surface neighboring or intersecting the first main surface and the second main surface (i.e. surface corresponding to the side surface of the light emitting device) may be referred to as an end surface or side surface.

When the configuration of the two main surfaces and the side surfaces adjacent to the mounting surface is described, the distance from the mounting surface will sometimes be called the height of the light emitting device. Also, the side closer to the mounting surface will sometimes be called "downward," the side closer to the face opposite the mounting face "upward," and the positional relation in the horizontal direction to the mounting face "to the side."

The shape of the main face of the various members will sometimes be called the planar shape.

The light emitting device in this embodiment is a side-emission type (called a side-view type) of light emitting device. This light emitting device mainly includes a substrate, a light emitting element, and a sealing member.

The substrate includes a first main surface that serves as the emission surface and on which the light emitting element is mounted, a second main surface that is opposite the first main surface, and a mounting surface that is at least adjacent to the second main surface. The substrate has an insulating base material, and a pair of connection terminals that electrically connect the light emitting element with the outside.

The sealing member is provided to the first main surface of the substrate, seals the light emitting element, and is formed substantially in the same plane as the substrate at the mounting surface.

On the second main surface of the substrate, a heat dissipation terminal is provided between the two connection terminals.

According to this embodiment, it is provided a compact, side-mount type of light emitting device that has good heat dissipation and affords easy mounting.

Substrate

The substrate has at least insulating base material, a pair of connection terminals that is formed on the insulating base material and is formed of a conductive material, and the heat dissipation terminal.

The shape of the substrate may be substantially the same as the external shape of the base material. For example, at least the first main surface and second main surface preferably have a substantially cuboid shape including a lengthwise direction and a widthwise direction that is perpendicular to the lengthwise direction. A surface adjacent to the long side of the second main surface is preferably the mounting surface.

In the case where a single light emitting element is installed in a single light emitting device, the lengthwise direction of the substrate preferably has a length that is about 1.5 to 5 times the length of one side of the light emitting element, and preferably the widthwise direction has a length of about 1.0 to 2.0 times the length of one side of the light emitting element. When a plurality of light emitting elements are installed in a single light emitting device, the length can be suitably adjusted as dictated by the number of elements. For instance, in the case where two or three light emitting elements are installed in the lengthwise direction, the lengthwise direction of the substrate is preferably from 2.4 to 6.0 times the length of one side of the light emitting elements.

Base Material

The base material can be formed of materials having lower solder wettability than connection terminals and insulating property. Examples of the base material include ceramics, resins, dielectric materials, pulp, glass or composite materials thereof (e.g. composite resins), or composite materials of the above-mentioned materials and conductive materials (e.g. metals, carbon etc.). Examples of the ceramic include aluminum oxide, aluminum nitride, zirconium oxide, zirconium nitride, titanium oxide and titanium nitride or those including mixtures thereof. Examples of the composite resin include glass epoxy resins.

As the resin, any resin used in the art may be used. Specific examples include epoxy resins, bismaleimide-triazine (BT) resins, polyimide resins, cyanate resins, polyvinyl acetal resins, phenoxy resins, acrylic resins, alkyd resins and urethane resins. Also, as the resins, BT resins containing a naphthalene-based epoxy resin and compositions thereof, commercial products (e.g. H1832NS and HL832NSF type LCA manufactured by Mitsubishi Gas Chemical Company, Inc.; MCL-E-700G and MCL-E-705G manufactured by Hitachi Chemical Company, Ltd.; and the like), and liquid crystal polymers and compositions thereof may be used. They may contain additives, monomers, oligomers, prepolymers and the like which are known in the art. Among those, BT resins or compositions thereof are preferred.

The base material is preferably a prepreg substrate of glass-modified silicone, glass silicone, or glass epoxy with a relatively low coefficient of linear expansion. For example, it is preferable to use a glass epoxy substrate with low linear expansion in which the coefficient of linear expansion has been adjusted to around 1 to 15 ppm by filling to a high degree with filler and glass cloth used in the field of semiconductor-use BGA mounting. The product of forming a conductive wiring pattern on a base material such as this can be used as the substrate.

The heat dissipation of the light emitting device can be improved by using a filler or glass cloth with good heat dissipation characteristics as the material of this prepreg board. Furthermore, a multilayer substrate can have parts built into its interior to impart the function of a protective element, etc.

Preferably, the difference in linear expansion coefficients between the base material and the light emitting element is within 10 ppm/° C. Accordingly, peeling of the light emitting element from the substrate (connection terminal) or application of undesired stress to the light emitting element due to a difference in linear expansion coefficient between the light emitting element and the substrate, which has been a problem heretofore, can be effectively prevented when the light emitting element is mounted on the substrate. As a result, electrodes of the light emitting element can be directly connected to connection terminals of the substrate by flip-chip mounting without using of the wires, so that a smaller and thinner light emitting device can be provided. In the present invention, the linear expansion coefficient means a value measured by the TMA method. One of $\alpha 1$ and $\alpha 2$ should satisfy this value, but it is more preferred that both $\alpha 1$ and $\alpha 2$ meet the value.

For example, the resin has a glass transition temperature of preferably about 250° C. or higher. Accordingly, defects such as a connection failure of the light emitting element can be avoided, without being affected by a temperature change in mounting of the light emitting element. As a result, the production yield of the light emitting device can be improved. The glass transition temperature may be measured by, for example, either a method (TMA, DSC, DTA or the like) in which a change in dynamic properties and heat absorption or heat generation are measured while the temperature of a sample is slowly elevated or lowered, or a method in which a response of a dynamic viscoelasticity measurement sample is measured while the frequency of a periodic force applied to the sample is changed.

The shape, size, thickness and the like of the base material in one light emitting device may be appropriately set. The thickness of the base material, depending on a material used, the type and a structure of the light emitting element placed, and the like, is, for example, preferably about 470 µm or less. The thickness of the base material is preferably about 20 µm or more when considering the strength and so on. The flexural strength of the base material is preferably equal to the strength of the substrate described above.

The shape of the first main surface of the base material is, for example, a circle, a polygon such as a quadrangle, or a shape close thereto. Among those, a rectangle is preferred. The size of the face in which the light emitting element is mounted is preferably larger than the later-described light emitting element.

Connection Terminals

The connection terminals are members that electrically connect the light emitting element to the outside of the light emitting device, and that are soldered in the mounting of the light emitting device to a mounting board, etc. Accordingly, at least a pair (positive and negative) is provided to a single light emitting device. The connection terminal is provided on the first main surface, the end surface between the first main surface and the second main surface and/or the second main surface of the substrate.

At least part of the edges of the connection terminals is preferably formed so as to coincide with a part of the mounting surface of the substrate. This allows the mounting surface and the connection terminals to come into contact (or be extremely close together) in the mounting of the light emitting device to the mounting board. As a result, the mounting of the light emitting device is facilitated.

The connection terminals have an element connection section that is connected to an electrode of the light emitting element, and an element connection section that is connected to the outside of the light emitting device with solder.

The element connection sections of the connection terminals are provided on the first main surface. The element connection sections of the two connection terminals are preferably provided opposite one another on the first main surface. This allows the light emitting element to be flip-chip mounted on the element connection sections. Also, each of the two element connection sections preferably extends to different directions of the end surface of the substrate and is connected to each of the element connection sections. Consequently, since the element connection sections are not provided so as to be aligned in the widthwise direction of the substrate, the width of the first main surface, that is, the height of the light emitting device, can be reduced.

The element connection sections may be provided anywhere on the base material, but are preferably provided to the two end surfaces of the substrate. Also, they are preferably provided on the second main surface of the substrate and the opposite first main surface of the substrate. Thus disposing the element connection sections affords more accurate alignment in the mounting of the light emitting device on the mounting board, and enhances the mounting position accuracy of the light emitting device. In particular, providing them to both end surfaces, the first main surface, and the second main surface allows alignment to be performed in both the direction in which the end surfaces are opposite (the lengthwise direction of the substrate) and the direction in which the first main surface and second main surface are opposite (the thickness direction of the substrate), so positional accuracy of the light emitting device can be improved. Also, the mounting strength of the light emitting device can be increased by increasing the surface area over which the light emitting device is joined by solder.

The element connection sections of the two connection terminals are preferably provided in a shape that is symmetrical in the lengthwise direction of the first main surface and/or second main surface of the substrate. This improves the mounting of the light emitting device. The element connection sections of the connection terminals are preferably separated from each other by a large distance at the first main surface and/or second main surface. That is, the element connection sections of the connection terminals are preferably each provided along a side in the widthwise direction of the substrate.

The width of the element connection sections of the connection terminals with respect to the lengthwise direction of the substrate can be from a few tens of microns to a few hundred microns, for example.

The connection terminal is not necessarily required to have the same width (e.g. length of the substrate in the widthwise direction) over the first main surface, the end surface and/or the second main surface of the substrate, and may be formed so as to be only partially reduced or increased in width. Alternatively, the connection terminal may be partially covered with an insulating material (e.g. base material) so as to be reduced in width at the first main surface and/or the second main surface of the substrate. Such a width-reduced region is preferably disposed on at least the first main surface of the substrate, and more preferably in the vicinity of the later-described sealing member.

By disposing the width-reduced region, a situation can be suppressed in which a bonding member such as that to be described below, etc. which is connected to the connection terminal, or flux or the like contained therein penetrates to below the later-described sealing member and further to below the light emitting element along the surface of the terminal. By separating the element connection section from the end surface of the substrate extending along the lengthwise direction, penetration of the flux can be suppressed in the same manner as described above when the light emitting element is mounted.

The material and laminar structure of the connection terminals is preferably a metal with excellent electrical conductivity and/or heat dissipation, such as copper. Also, it is preferable to use a laminar structure in which a plurality of types of metal are laminated. It is also preferable for the outermost layer before mounting with solder to be gold. This prevents corrosion and deterioration of the connection terminals, and the attendant soldering defects. Specific examples of the structure of the connection terminal include laminated structures such as W/Ni/Au, W/Ni/Pd/Au, W/NiCo/Pd/Au in the case where the base material is ceramics, etc., and such as Cu/Ni/Au, Cu/Ni/Pd/Au, Cu/NiCu/Ni/Au, Cu/Ni/Pd/Cu/Ni/Pd/Au in the case where the base material is glass-epoxy, etc.

Heat Dissipation Terminal

On the second main surface of the substrate, a heat dissipation terminal disposed in between the pair of connection terminals are provided. The heat dissipation terminal is exposed to the outside of the light emitting device, and is connected by solder at the time of the mounting of the light emitting device.

During the mounting of the light emitting device, the solder touches the part of the heat dissipation terminal adjacent to the mounting surface, then seeps upward from there, forming a solder fillet. This allows a heat dissipation path to the mounting board to be formed at a portion of the second main surface of the light emitting device other than at the pair of connection terminals.

The height of the heat dissipation terminal is preferably lower than the height of the light emitting device. This reduces the upward seepage of the solder and improves mounting of the light emitting device. It is particularly preferable for this height to be no more than half the height of the light emitting device. This allows an adequate solder fillet to be formed while maintaining good mountability of the light emitting device, and ensures good fixing strength and heat dissipation. The height of the heat dissipation terminal is preferably lower than the height of the connection terminals.

The width of the heat dissipation terminal can be suitably selected according to the size of the light emitting device and other factors. For example, in the case where the width in the lengthwise direction of the light emitting device is about 3 mm, then the width of the heat dissipation terminal is preferably about 0.1 to 1 mm, more preferably about 0.3 to 0.6 mm, and even more preferably about 0.4 mm.

In the mounting of the light emitting device, the solder fillet is preferably provided so that the volume of the solder fillet on the first main surface is substantially equal to that of the solder fillet on the second main surface, or so that the ratio is about 1:1.5. That is, the volume of the solder fillet formed at the element connection sections at the first main surface, and the total volume of the solder fillet formed at the heat dissipation terminal and the element connection sections at the second main surface are preferably either substantially equal or have a ratio of about 1:1.5. This enhances alignment accuracy in the direction in which the first main surface and second main surface are opposite. This adjustment of the fillet size can be accomplished by adjusting the width or height of the element connection sections and the heat dissipation terminal, or by adjusting the shape of the heat dissipation pattern and the mounting electrodes on the mounting board side.

The heat dissipation terminal is preferably provided in the center of the second main surface of the substrate, in a shape with line symmetry.

A plurality of heat dissipation terminals can be provided to a single light emitting device. In this case, they are preferably provided in line symmetry with respect to the mounting surface. This ensures good heat dissipation of the light emitting device. Also, the height of the heat dissipation terminals can be lowered, the surface area of the heat dissipation terminals can be increased, and the mounting and heat dissipation properties of the light emitting device can be enhanced.

The heat dissipation terminal is preferably connected through a via to the terminal provided to the first main surface of the substrate. This terminal is also preferably joined with a joining member to a light emitting element. It is preferable for a plurality of vias to be provided. This allows heat generated from the light emitting element to be dissipated more effectively from the heat dissipation terminal. The via is preferably made of materials such as metals, which has good heat dissipation and/or electrical conductivity.

In the case where the heat dissipation terminal has a plurality of narrow parts, concave components are preferably provided in between the narrow parts, that is, to the insulating base material. Consequently, in the soldering of the light emitting device, gas generated during the heating of the solder paste can be released from the concave components, and this enhances the mounting of the light emitting device.

A variety of different planar shapes can be selected for the heat dissipation terminal, from the standpoint of productivity, mounting, ease of alignment, and so forth. For example, the heat dissipation terminal has a narrow part and a wide part. The wide part has a width wider than that of the narrow part. The narrow part is preferably provided at a place adjacent to the mounting surface, and the wide part is preferably provided at a place adjacent to the narrow part and away from the mounting surface. The heat dissipation terminal has a plurality of narrow parts. The height of the heat dissipation terminal is preferably the height of the light emitting device, such as about no more than one half the width in the widthwise direction of the base. This suitably suppresses upward seepage of the solder, and enhances the mountablity of the light emitting device. The heat dissipation terminal may be disposed in the above-mentioned shape by using a solder resist (discussed below). For example, a heat dissipation terminal having a height of no more than half the height of the substrate may be obtained by using a solder resist to cover part of the metal formed continuously up to the upper end of the base.

The material and laminar structure of the heat dissipation terminal can be the same as the material used for the above-mentioned connection terminals.

The heat dissipation terminal may be disposed simultaneously with the connection terminals, or separately. Also, the laminar structure may be the same or different.

The surfaces of the connection terminals and the heat dissipation terminal may be substantially flat, or the thickness or number of layers may vary from one place to the next. That is, the surfaces may be textured.

In the case where a plurality of light emitting elements are installed in a single light emitting device, more heat may be generated from the light emitting elements, and that the reliability of the light emitting device will suffer, but the reliability of the light emitting device can be enhanced by providing a heat dissipation terminal.

In this case, the heat dissipation terminal is preferably provided between the plurality of light emitting elements on the second main surface, that is, at a position that is opposite the portion between light emitting elements on the first main surface. This allows heat to be effectively dissipated from the light emitting elements.

In addition to the pair of connection terminals, a second connection terminal may also be provided to the first main surface of the substrate. Also, a light emitting element may be mounted on the second connection terminal. For example, two light emitting elements may each be electrically connected to one of the two connection terminals and to the second connection terminal, which allows the light emitting elements to be connected in series.

Also, the heat dissipation terminal is preferably connected to this second connection terminal. Exposing this second connection terminal at the first main surface and joining it with solder may be difficult from the standpoint of making the light emitting device more compact. In particular, it may be difficult in the case where the second connection terminal is provided between a pair of element connection sections that are opposite each other in the lengthwise direction of the substrate, and a pair of element connection sections is provided at both ends in the lengthwise direction of the substrate. However, if this second connection terminal is connected to the heat dissipation terminal provided to the second main surface through a via that goes through the base material, a heat dissipation path can be disposed on the second main surface side regardless of the shape or position of the pair of connection terminals or the second connection terminal, and the heat dissipation of the light emitting device can be enhanced.

The heat dissipation terminal may also have polarity in addition to its role as an electrode that is electrically connected to the exterior of the light emitting device, but need not have polarity.

In order to manufacture a plurality of light emitting devices at once, substrate composite substrate in which a plurality of substrates used for each individual light emitting device are connected together in a matrix can be used.

In the case where light emitting devices are manufactured using a composite substrate, the heat dissipation terminal preferably has a narrow part provided at a place adjacent to the mounting surface, and a wide part that is wider than the narrow part and above the narrow part. In other words, the wide part is preferably provided at a place adjacent to the narrow part and away from the mounting surface. When the individual light emitting devices are separated from the composite substrate, there is the risk that there will be burrs on the end surfaces of the substrates, but these burrs can be made smaller by cutting at the narrow parts.

Solder Resist

The second main surface of the substrate may be equipped with a solder resist whose solder wettability is lower than that of the connection terminals and the heat dissipation terminal. This allows for control of the position where the solder is formed at the time of mounting of the light emitting device, and prevents bridging, shorting, and the like between the terminals. The solder resist is usually formed by a resin composition that is electrically insulating, and is provided in the form of a film.

The solder resist is provided to the surface of the substrate. For example, it is provided between the pair of connection terminals, between the connection terminals and the heat dissipation terminal, between a plurality of heat dissipation terminals, or on the surface of the base material. It may also cover part of the heat dissipation terminal. Also, in the case where the height of the heat dissipation terminal is lower than the height of the substrate, the solder resist is preferably disposed above the heat dissipation terminal. This allows the solder to be formed at the right place.

As discussed above, the solder resist can define the shape of the heat dissipation terminal. For example, in the case where the solder resist covers at least part of a metal part provided in a surface area greater than that of the heat dissipation terminal, then the portion exposed from the solder resist can serve as the heat dissipation terminal. Similarly, in the case where a plurality of heat dissipation terminals are provided, one of the metal parts can be covered with a solder resist having a plurality of cut-outs, and the portions exposed at the cut-outs can serve as the plurality of heat dissipation terminals. In other words, the heat dissipation terminal may be formed of part of a metal film provided in a surface area greater than that of the heat dissipation terminal, and is demarcated such that the solder resist covers at least part of the metal film, and exposes another part of the metal film. That is, a metal film is disposed on the second main surface, at least part of the metal film is covered by the solder resist such that an exposed part of the metal film is defined and serves as a heat dissipation terminal between the pair of connection terminals.

Also, the solder resist can separate the heat dissipation terminal from the pair of connection terminals.

The substrate may itself form a protective element such as a capacitor, a varistor, a zener diode or a bridge diode. Also, the substrate may include a structure, which performs the function of these elements, as a part thereof in the form of, for example, a multilayer structure or a laminated structure. By using one that performs the above-mentioned element function, the substrate can be made to function as a light emitting device without additionally carrying components. As a result, a high-performance light emitting device having improved electrostatic withstand voltage can be made smaller.

The substrate is not limited to one in which connection terminals and a heat dissipation terminal in the form of a thin-film are provided to the surface of a plate-form base material, and a molded resin and plate-form metal leads may instead be formed integrally. That is, part of the connection terminals and/or the heat dissipation terminal may be embedded in the molded resin, and exposed from the molded resin on the exterior of the light emitting device.

(Light Emitting Element

The light emitting element include, for example, a light transmissive element substrate, a semiconductor laminate laminated on the element substrate and a pair of electrodes formed on a surface of the semiconductor laminate.

The semiconductor laminate is formed, for example, by laminating a first semiconductor layer (e.g. n-type semiconductor layer), a light emitting layer and a second semiconductor layer (e.g. p-type semiconductor layer) in this order, and contributes to light emission. Preferably, the nitride semiconductor laminate has, on the same surface (e.g. surface on the second semiconductor layer side), both a first electrode (positive or negative) electrically connected to the first semiconductor layer and a second electrode (negative or positive) electrically connected to the second semiconductor layer.

Examples of the type and the material of the first semiconductor layer, the light emitting layer and the second semiconductor layer include various semiconductors such as group III-V compound semiconductors and group II-VI compound semiconductors. Specific examples include nitride-based semiconductor materials such as $In_XAl_YGa_{1-X-Y}N$ ($0 \leq X$, $0 \leq Y$, $X+Y<1$), and InN, AlN, GaN, InGaN, AlGaN, InGaAlN and the like can be used. For the film thickness and the layer structure of each layer, those known in the art can be used.

The shape of the light emitting element in plan view is preferably a quadrangle or a shape close to a quadrangle that has an long side and a shorter side for a light extraction surface. The upper limit of the size of light emitting elements can be appropriately adjusted according to a size of the light emitting device. The length of one side of the light emitting element is, for example, about 100 μm to 2 mm. In the case where the light emitting device is a side-view type, the length of the long sides to short sides of rectangule is preferably about 2:1 to 50:1. Mounting the elongated light emitting element achieves a high output light emitting device even though it is difficult to increase the height for the side-view type light emitting devices that are required to be thinner.

First Electrode and Second Electrode

Preferably, the first electrode and the second electrode are disposed on the same surface (surface opposite to the substrate in the presence of the substrate) of the semiconductor laminate. Accordingly, flip-chip mounting can be performed with the positive and negative connection terminals of the substrate made opposite to the first electrode and the second electrode of the light emitting element.

The first electrode and the second electrode can be formed from, for example, a single-layer film or laminated film of Au, Pt, Pd, Rh, Ni, W, Mo, Cr, Ti and the like or an alloy thereof. Specific examples include laminated films laminated like Ti/Rh/Au, W/Pt/Au, Rh/Pt/Au, W/Pt/Au, Ni/Pt/Au and Ti/Rh from the semiconductor layer side. The film thickness may be any film thickness of films that are used in the art.

In the first electrode and the second electrode, on sides close to the first semiconductor layer and the second semiconductor layer, respectively, it is preferred that each electrode is provided with, as a part of the electrode, a material layer having a higher reflectivity to light emitted from the light emitting layer as compared to other materials of the electrode. Examples of the high-reflectivity material include silver or silver alloys and aluminum. In the case where silver or a silver alloy is used, it is preferred to form a covering layer that covers a surface (preferably the upper surface and the end surface) of the material layer for preventing migration of silver. Examples of the above-mentioned covering layer include, for example, a single layer or a laminated layer containing aluminum, copper, nickel and the like.

As long as the first electrode and the second electrode are electrically connected to the first semiconductor layer and the second semiconductor layer, respectively, the entire surface of the electrode is not required to be in contact with the semiconductor layer, or the first electrode is not required to be situated wholly on the first semiconductor layer and/or the second electrode is not required to be situated wholly on the second semiconductor layer.

The shape of each of the first electrode and the second electrode can be set according to a shape of the semiconductor laminate, a shape of the connection terminal (more specifically the element connection section) of the substrate, or the like. Preferably, the first electrode, the second electrode and the element connection section each have a quadrangle shape in plan view or a shape close thereto. In the case where the shape of each of the first electrode and the second electrode is substantially the same as the shape of the corresponding element connection section, bonding and registering of the semiconductor laminate with the substrate can be easily performed by making use of a self-alignment effect. In this case, it is preferred that the plane shapes of the first electrode and the second electrode are substantially the same at least at the outermost surface of the semiconductor laminate connected to the substrate.

In the case where the light emitting element is flip-chip mounted, a protrusion may be disposed on the upper surfaces of a first electrode and a second electrode at the portions that are connected to the connection terminals of the substrate. This makes it easier for the sealing member to fill in between the light emitting element and the substrate, and reduces how much of the light emitted from the light emitting element is transmitted to the substrate. Also, the light emitting element and the substrate can be securely joined, which improves the reliability of the light emitting device.

The upper surface shape of the protrusions provided to the electrodes of the light emitting element and the planar shape of the portions of the connection terminals where the light emitting element is mounted are preferably substantially the same. This facilitates mounting of the light emitting element through a self-alignment effect.

These protrusions are provided at the desired height from the upper surfaces of the electrodes on which the protrusions are formed, and are preferably formed at a height of a few microns to about 100 µm, for example.

The thickness of the light emitting element is preferably 800 µm or less, more preferably 500 µm or less, 400 µm or less, 300 µm or less, 200 µm or less, or 150 µm or less as a thickness including the electrode and the growth substrate of a semiconductor. The size of the light emitting element is preferably a few mm or less, for example, a thousand and a few hundreds µm or less.

The light emitting element is installed on the substrate. It is preferably for the light emitting element to be flip-chip mounted, and particularly preferably for the light emitting element to be flip-chip mounted on the pair of connection terminals provided opposite each other on the substrate. More specifically, the first electrode and second electrode provided on the opposite side of the light emitting element from the substrate are joined to the connection terminals of the substrate.

This joining can be accomplished by using a joining material of a material known in this field. Examples include a solder based on tin-bismuth, tin-copper, tin-silver, gold-tin, or the like (more specifically, an alloy whose main components are silver, copper, and tin, an alloy whose main components are copper and tin, an alloy whose main components are bismuth and tin, or the like), an eutectic alloy (an alloy whose main components are gold and tin, an alloy whose main components are gold and silicon, an alloy whose main components are gold and germanium, or the like), a conductive paste or bump of silver, gold, palladium, or the like, an anisotropic conductive material, and a braze of a low-melting point metal. Of these, using solder can afford a very accurate self-alignment effect in the above-mentioned connection terminals. Thus, it is easier to mount the light emitting element in the right place, mass production is facilitated, and a more compact light emitting device can be manufactured.

The joining material is preferably about 2 to 50 µm thick, for example.

An example of the joining method is to dispose the joining member and a melting auxiliary (flux) on the connection terminals of the substrate, dispose the light emitting element over this, and then heat to about 300° C. to effect reflow.

One or more light emitting elements may be installed on the substrate. The size, shape, and emission wavelength of the light emitting element can be suitably selected. In the case where a plurality of light emitting elements are installed, they may be laid out irregularly, or they may be laid out periodically or regularly, such as in rows and columns. For example, a plurality of light emitting elements are preferably mounted and aligned in a lengthwise direction of the light emitting device. The light emitting elements may be connected in serial, parallel, serial-parallel, or parallel-serial, and a circuit may be formed so that the elements can be driven independently.

In the case that the light emitting device include a plurality of the light emitting elements, the plurality of the light emitting elements may be each mounted on two of terminals among the pair of connection terminals and at least the second connection terminal.

Sealing Member

The sealing member is disposed on a first main surface of the substrate and seals the light emitting element. The sealing member is formed such that the sealing member forms the substantially same plane with the substrate on the mounting surface. Examples of the material of the sealing member include ceramics, resins, dielectric materials, pulp, glass and composite materials thereof.

Examples of the resin preferable for the sealing member include thermosetting resins, thermoplastic resins, modified resins thereof and hybrid resins at least one of these resins. Specific examples include resins such as epoxy resin compositions, modified epoxy resin compositions (silicone-modified epoxy resins etc.), silicone resin compositions, modified silicone resin compositions (epoxy-modified silicone resins etc.), hybrid silicone resins, polyimide resin compositions, modified polyimide resin compositions, polyamide resins, polyethylene terephthalate resins, polybutylene terephthalate resins, polycyclohexane terephthalate resins, polyphthalamide (PPA), polycarbonate resins, polyphenylene sulfide (PPS), liquid crystal polymers (LCP), ABS resins, phenol resins, acrylic resins, PBT resins, urea resins, BT resins and polyurethane resins. Among those, thermosetting resins are preferred because it is hard to degrade by light of heat from the light emitting element.

The sealing member may be light transmissive or light blocking, but is more preferably a light blocking material having a reflectivity of 60% or more, 70% or more, 80% or more or 90% or more to light from the light emitting element. Thus, it is preferred that the above-described material, e.g. a resin contains, for example, a light reflection material, a light scattering material, a colorant and the like such as titanium dioxide, silicon dioxide, zirconium dioxide, potassium titanate, alumina, aluminum nitride, boron nitride, mullite, niobium oxide, zinc oxide, barium sulfate, carbon black and various kinds of rare earth oxides (e.g. yttrium oxide and gadolinium oxide).

The sealing member may contain a fibrous filler such as glass fibers or wollastonite, or an inorganic filler such as carbon. The sealing member may contain a material having high heat releasability (e.g. aluminum nitride etc.). Further, the sealing member may contain the later-described phosphor. Preferably, the sealing member contains these additives in an amount of, for example, about 10 to 95% by weight based on the total weight of the sealing member.

In the case where the sealing member contains a light reflection material, light from the light emitting element can be efficiently reflected. Particularly, by using a material having a light reflectivity higher than that of the substrate (for example, by using a silicone resin containing titanium dioxide as a sealing member in the case where aluminum nitride is used for the substrate), light extraction efficiency of the light emitting device can be enhanced by reducing the size of the substrate while handling characteristics are retained. By forming the sealing member from a material having high heat releasability, heat releasability of the light emitting device can be improved.

As long as the sealing member seals the light emitting element and is formed such that the sealing member formed the same plane with the substrate on the mounting surface, the outer shape of the sealing member may be, for example, a cylindrical shape, a polygonal prism shape such as a quadrangular prism shape or a shape close thereto, a circular truncated cone shape, a polygonal truncated cone shape such as a quadrangular truncated cone shape, or a lens shape in part. Among those, the sealing member preferably has a shape that is narrow and long in the lengthwise direction of the substrate.

At least one of the end surfaces of the sealing member running along the lengthwise direction, which serves as the mounting surface for the light emitting device, is formed in substantially the same plane as one of the end surfaces running in the lengthwise direction of the substrate, but preferably the end surface on the side opposite the mounting surface is also formed in the same plane as the substrate. Consequently, the outer surface of the light emitting device can be formed by the sealing member, the external form of the light emitting device can be made larger, the surface area of the light extraction surface can be increased, and the light extraction efficiency can be raised. In the case where the element connection sections of the connection terminals are provided to the first main surface of the substrate, the sealing member is preferably disposed to the inside of the edge running along the widthwise direction of the first main surface of the substrate. Also, the sealing member may cover substantially the entire first main surface of the substrate. That is, when viewed from the light extraction surface, the external shape of the sealing member may be the same as the external shape of the substrate. This allows the light emitting device to be more compact.

The term "in the same plane" in the specification is not limited to a strict interpretation, and in the case where the sealing member has a somewhat rounded shape, some part of this rounded shape should coincide with the end surface of the substrate.

The size of the sealing member is preferably larger than the light emitting element in terms of a plane area as seen from the light extraction surface side. Particularly, the length of the outermost shape of the sealing member in the lengthwise direction is preferably about 1.01 to 4.0 times of the length of one side of the light emitting element. Specifically, a length of about 100 to 1000 µm is preferred, and a length of about 200 to 800 µm is more preferred. The thickness of the sealing member (also referred to as a width from the end surface of the light emitting element to the outermost shape of the sealing member as seen from the light extraction surface side, or a minimum width of the sealing member at the side surface of the light emitting element) is, for example, 0 to 100 µm, preferably about 5 to 80 µm or about 10 to 50 µm.

The sealing member is preferably disposed in contact with a part or the whole of at least one side surface of the light emitting element so as to cover the side surface of the light emitting element, or preferably disposed in contact with the light emitting element so as to surround the entire periphery of the light emitting element.

Preferably, the sealing member is provided so as to fill a gap between the mounted light emitting element and the substrate. The strength of the light emitting device can be accordingly enhanced. The sealing member disposed between the light emitting element and the substrate may be a material different from the material covering the side surface of the light emitting element. Accordingly, suitable functions can be imparted to the sealing member disposed on the side surface of the light emitting element and the member disposed between the light emitting element and the substrate. For example, a material having a high reflectivity can be used for the sealing member disposed on the side surface of the light emitting element, and a material for strengthening adhesion between the light emitting element and the substrate can be used for the member disposed between the light emitting element and the substrate.

The linear expansion coefficient of the resin used in the sealing member is preferably about 100 ppm/° C. or less and the glass transition temperature is preferably about 100° C. or lower. The sealing member and the substrate can be accordingly prevented from being peeled from each other.

Any forming method for the sealing member may be used. In the case where the sealing member is formed of resin, it can be formed by screen printing, potting, transfer molding, a compression molding or the like. In the case where a molding machine is used, a mold release film may be used. In the case where the sealing member is formed of thermosetting resin, transfer molding is preferred.

Light Transmissive Member

The light transmissive member may be disposed on the light extraction surface for the sake of the protection, etc., for the light emitting element.

Preferably, the light transmissive member covers the upper surface of the sealing member in the case where the light emitting element is covered with the light blocking sealing member. The end surface of the light transmissive member may be covered with or may be not covered with the sealing member.

The light transmissive member is preferably one permeable to 60% or more, further preferably 70%, 80% or 90% or more of light emitted from the light emitting layer. The light transmissive member may be a member similar to the sealing member, or may be a member different from the sealing member. Examples include resins such as silicone resins, silicone modified resins, epoxy resins, epoxy modified resins, phenol resins, polycarbonate resins, acrylic resins, TPX resins, polynorbornene resins, and hybrid resins containing at least one of these resins, and glass. Among those, silicone resins or epoxy resins are preferred, and silicone resins having excellent light resistance and heat resistance are more preferred.

The light transmissive member is preferably one containing a phosphor that is excited by light from the light emitting element. As the phosphor, one known in the art can be used. Examples include yttrium-aluminum-garnet (YAG)-based phosphors activated by cerium, lutetium-aluminum-garnet (LAG)-based phosphors activated by cerium, nitrogen-containing calcium aluminosilicate ($CaO$—$Al_2O_3$—$SiO_2$)-based phosphors activated by europium and/or chromium, silicate (($Sr, Ba)_2SiO_4$)-based phosphors activated by europium, β-sialon phosphors, nitride-based phosphors such as CASN-based or SCASN-based phosphors, KSF-based phosphors ($K_2SiF_6$:Mn) and sulfide-based phosphors. Accordingly, there can be provided a light emitting device that emits mixed-color light (e.g. white light) of primary light and secondary light having a visible wavelength, and a light emitting device that is excited by primary light of ultraviolet light to emit secondary light having a visible wavelength.

For example, the phosphor is preferably one having a central particle size of 30 μm or less. The central particle size can be measured and calculated using a commercially available particle measurement device, a particle size distribution measurement device, or the like. The phosphor may be a luminescent material referred to as a so called nanocrystal or quantum dot.

The phosphor is not only included in the light transmissive member, but also may be set as another member separated from the light emitting device.

The light transmissive member may contain a filler (e.g. a diffusing agent, a colorant or the like). Examples include silica, titanium oxide, zirconium oxide, magnesium oxide, glass, a crystal or sintered body of a phosphor, and a sintered body of a phosphor and an inorganic binding material. Optionally, the refractive index of the filler may be adjusted. The refractive index is, for example, 1.8 or more.

The amount of the phosphor and/or the filler is, for example, preferably about 10 to 80% by weight based on the total weight of the light transmissive member.

Examples of the method for forming a light transmissive member include a method in which a light transmissive member is molded in the form of a sheet, and bonded by a hot melt method or by an adhesive, a method in which a phosphor is deposited by an electrophoretic deposition method, and then impregnated with a light transmissive resin, potting, compression molding, a spraying method, an electrostatic coating method and a printing method.

Among those, a spraying method, particularly a pulse spraying method of injecting spray pulsewise, i.e. intermittently is preferred. Thus, deviation of the distribution of the phosphor can be suppressed, and occurrence of color irregularity etc. of the light emitting element can be avoided.

The thickness of the light transmissive member is not particularly limited, and is, for example, about 1 to 300 μm, preferably about 1 to 100 μm, more preferably about 2 to 60 μm or about 5 to 40 μm.

The upper surface of the light transmissive member may be flat, or it may have fine texturing, or it may have a lens shape, etc.

The light emitting device here can also be applied to a method in which a plurality of light emitting devices are manufactured at once with a composite substrate, and are finally separated into individual light emitting devices. That is, a plurality of light emitting devices can be manufactured by preparing a plurality of light emitting elements, joining these light emitting elements to the connection terminals of a composite substrate in which a plurality of substrates are connected, integrally covering the light emitting elements with a sealing member and a light transmissive member, and then splitting the sealing member and the substrates.

The splitting of the sealing member and substrates can be accomplished using a method that is known in this field, such as splitting/machining with a blade, a laser, or the like.

Figure 15:
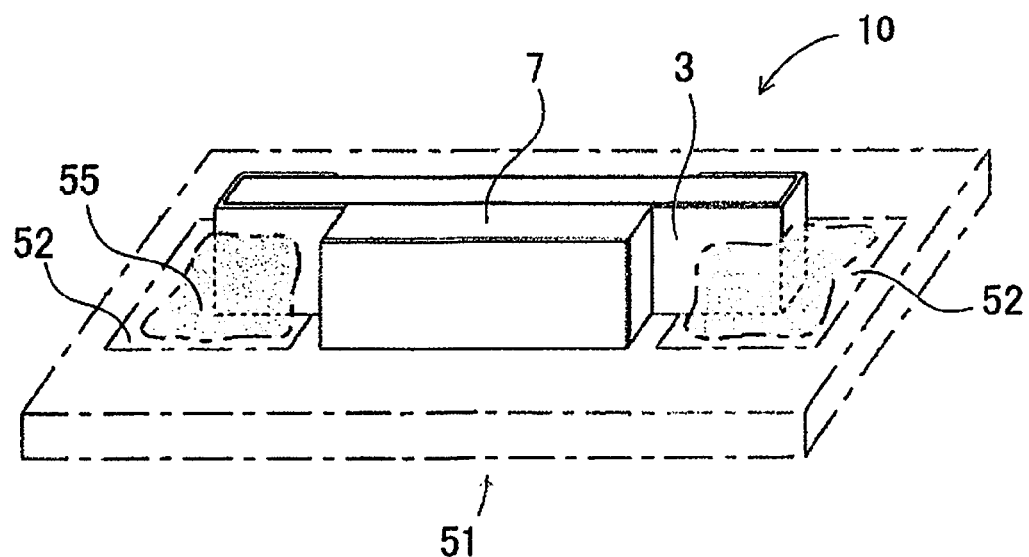
FIG. 15 is a simplified oblique view of the state when the light emitting device in an embodiment of the present invention has been mounted on a mounting board.
Figure 16:
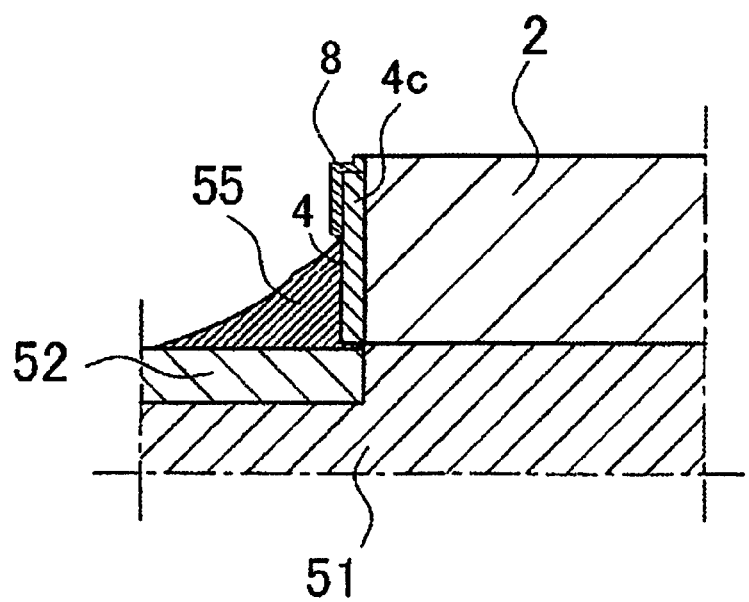
FIG. 16 is a simplified cross section of the state when the light emitting device in an embodiment of the present invention has been mounted on a mounting board.
Figure 17:
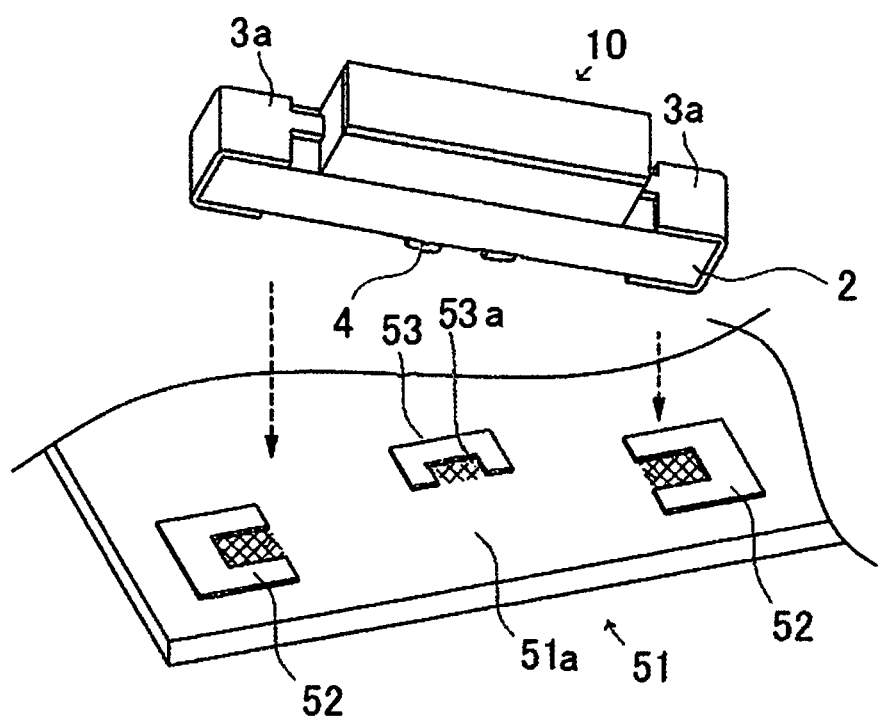
FIG. 17 is a simplified oblique view of an example of a light emitting device and a mounting board when the light emitting device in an embodiment of the present invention is mounted.

The above-mentioned light emitting device is mounted by solder onto a mounting board and electrically connected. For example, as shown in FIGS. 15 to 17, a light emitting device 10 is mounted and joined with solder 55 on a mounting board 51 comprising an insulating board 51a, a pair of positive and negative mounting-side electrodes 52 on the surface thereof, and a heat dissipation pattern 53. The solder 55 forms solder fillets at the first main surface, the second main surface, a pair of element connection sections 3a provided to the four end surfaces in between these, and a heat dissipation terminal 4.

In the case where the height of the element connection sections is 0.3 to 0.4 mm, for example, the size of the solder fillets formed by joining solder to the element connection sections of the light emitting device is about 50 to 350 μm, and preferably about 100 to 250 μm, with the solder fillets provided so that they spread out in the direction away from the light emitting device. The height is preferably about 150 to 400 μm.

The solder fillet joined to the element connection section provided to the first main surface preferably extends a shorter distance away from the light emitting device than the solder fillets formed on the element connection sections provided to the end surfaces. Since the first main surface is on the light emission surface side of the light emitting device, when the solder fillet provided to the first main surface is made smaller, the distance can be reduced between the light emitting device and the member that receives the light of the light emitting device (such as a light guide plate). The mounting strength of the light emitting device can be increased by making the solder fillets at the end surfaces larger than the solder fillet of the first main surface.

As shown in the cross section in FIG. 16 and FIG. 17, the heat dissipation terminal 4 is joined by the solder 55 onto a heat dissipation patten 53. The height of the heat dissipation terminal 4 is about one half the height of the light emitting device 50. This improves the mounting of the light emitting device. A solder resist 8 is provided above the heat dissipation terminal 4, and covers a covered part 4c that is contiguous with the heat dissipation terminal 4. The solder resist 8 is not wetted by the solder 55, so the covered part 4c covered by the solder resist 8 is not connected to the solder 55.

The heat dissipation terminal 4 may be joined to the mounting-side electrodes 52 that the element connection section 3a is joined.

FIG. 17 shows an example of the light emitting device and the mounting board 51. In the case where a concave component is provided between the narrow parts of the heat dissipation terminal 4, the pattern or the electrode to which the heat dissipation terminal is mounted preferably has a cut-out 53a at a position directly under the concave component at the time of mounting. Providing this cut-out allows any gas generated during soldering to be effectively released from the cut-out.

Embodiments of the light emitting device will now be described in specific terms through reference to the drawings.

Embodiment 1

Figure 1B:
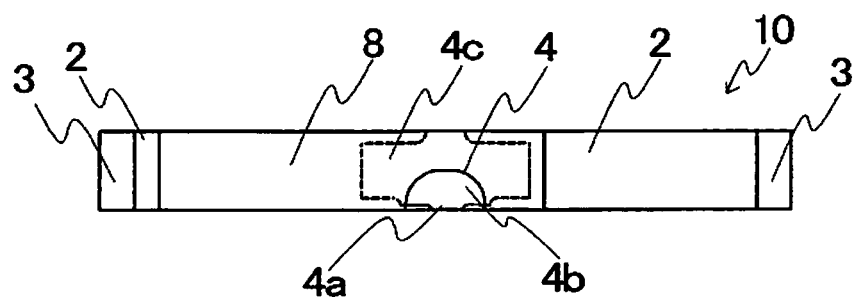
Figure 1C:
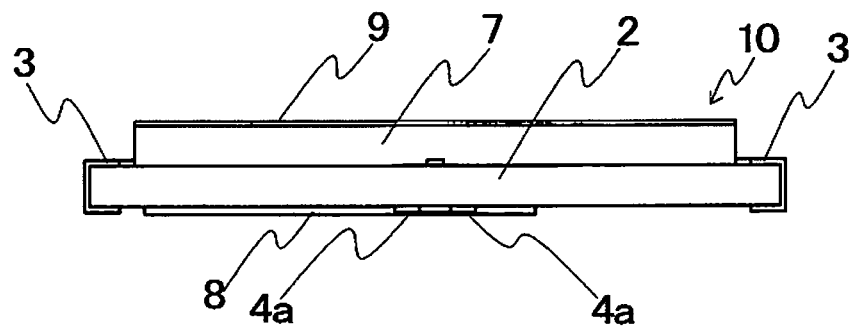
Figure 1D:
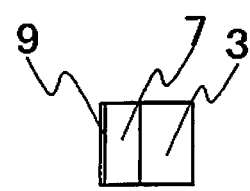
Figure 2:
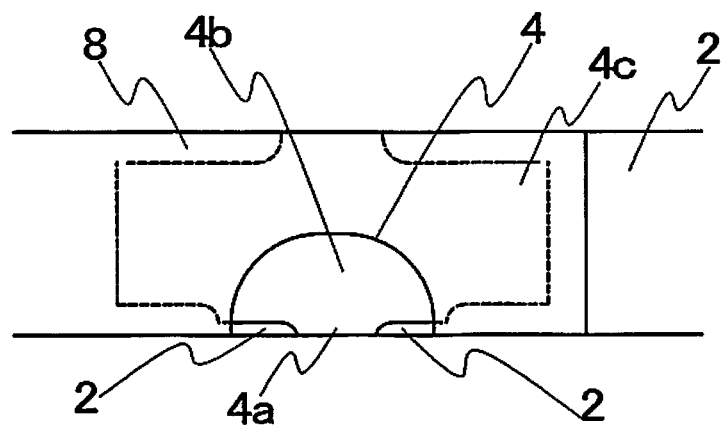
FIG. 2 is a simplified detail view of a portion of the rear face of the light emitting device in FIG. 1B.

FIGS. 1 and 2 show the light emitting device 10 in this embodiment.

As shown in FIGS. 1A to 1D and FIG. 2, the light emitting device 10 in this embodiment includes a substrate 1 having a pair of positive and negative connection terminals 3 and an insulating base material 2 on whose surface the connection terminals 3 are provided; two light emitting elements 5 mounted on the connection terminals 3 of the first main surface of the substrate 1; a light-blocking sealing member 7 contains a light reflection material and covers the side surfaces of the two light emitting elements 5; the heat dissipation terminal 4 provided on the base material 2 of the second main surface of the substrate 1; and a light transmissive member 9 that contains a phosphor and continuously covers the two light emitting elements 5 and the upper surface of the sealing member 7.

The two light emitting elements 5 are flip-chip mounted to the connection terminals 3, aligned in the lengthwise direction of the light emitting elements, on the first main surface of the substrate. The outer shape of the light emitting elements is indicated by broken lines in FIG. 1A.

As shown in FIG. 1B, the heat dissipation terminal 4 is provided in a shape that is in line symmetry with the center in the lengthwise direction of the substrate 1. The solder resist 8 is provided between the heat dissipation terminal 4 and one of the connection terminals 3 on the second main surface of the substrate 1. The solder resist 8 coves the covered part 4c, which is part of the metal part that serves as the heat dissipation terminal, and the portion that is exposed from the solder resist 8 becomes the heat dissipation terminal 4. In FIGS. 1B and 2, the outer shape of the covered part 4c is indicated by a broken line.

The substrate 1 has a substantially cuboid shape in which the width in the lengthwise direction of the first main surface and the second main surface is 3.5 mm, the width in the widthwise direction (the height) is 0.4 mm, and the thickness is 0.2 mm.

The connection terminals 3 are provided to the second main surface of the base material 2 (that is, the second main surface of the substrate) from the first main surface of the base material 2 through each of side surfaces. The element connection sections 3a are provided contacting with the side of the base material 2 in the widthwise direction, in the form of a band with a width of 0.175 mm, all the way in the height direction of the base material 2. They are also provided so as to cover the entire base material 2 on the side surface of the substrate 1. The element connection sections 3a are provided in substantially the same shape at opposing positions on the first main surface and second main surface of the substrate 1.

The heat dissipation terminal 4 is provided in between the pair of connection terminals and in the center in the lengthwise direction of the second main surface of the substrate 1. The heat dissipation terminal is provided at a height that is lower than the height of the light emitting device, that is, away from the surface of the base material that is opposite the mounting surface. Narrow parts 4a are provided at places adjacent to the mounting surface of the light emitting device 10, and more precisely, so that their ends coincide with the mounting surface. The narrow parts 4a of the heat dissipation terminal 4 have a width in the lengthwise direction of the substrate of 0.2 mm and a height of 0.03 mm. The narrow parts 4a are connected to a wide part 4b above. The wide part 4b is substantially semicircular, becoming narrower toward the upward, with a width in the lengthwise direction of the substrate 1 of 0.4 mm and a height of 0.18 mm. The narrow parts 4a and the wide part 4b are smoothly connected so that the width of the narrow parts 4a increases at the portion closer to the wide part 4b. The heat dissipation terminal 4 has an overall width in the lengthwise direction of the substrate 1 of 0.4 mm and a height of 0.2 mm.

The solder resist 8 is provided 0.13 mm away from the connection terminals 3 in the lengthwise direction of the substrate 1, and so that the width in the lengthwise direction of the substrate 1 is 1.95 mm. It is provided around the heat dissipation terminal 4, or more precisely, so as to surround it from the side and from above. The solder resist 8 covers the wide part 4b of the heat dissipation terminal 4 from above so as to expose the heat dissipation terminal 4, and this demarcates the shape of the heat dissipation terminal 4 (more precisely, the wide part 4b).

On the second main surface of the substrate 1, the insulating base material 2 is exposed at the portions under the wide part 4b and to both sides of the narrow parts 4a, and the portion between the solder resist 8 and the connection terminals 3.

The sealing member 7 is substantially cuboid in its external shape, with a width of 3.0 mm, a height of 0.4 mm, and a thickness of 0.25 mm.

Embodiment 2

FIGS. 3A to 3D and 4 show the light emitting device 20 in this embodiment.

As shown in FIGS. 3A to 3D and FIG. 4, the light emitting device 20 in this embodiment includes a substrate 1 having a pair of positive and negative connection terminals 3 and an insulating base material 2 on whose surface the connection terminals 3 are provided; two light emitting elements 5 mounted on the connection terminals 3 of the first main surface of the substrate 1; a light blocking sealing member 7 contains a light reflection material and covers the side surfaces of the two light emitting elements 5; the heat dissipation terminal 4 provided on the base material 2 of the second main surface of the substrate 1; and a light transmissive member 9 that contains a phosphor and continuously covers the two light emitting elements 5 and the upper surface of the sealing member 7.

Figure 3A:
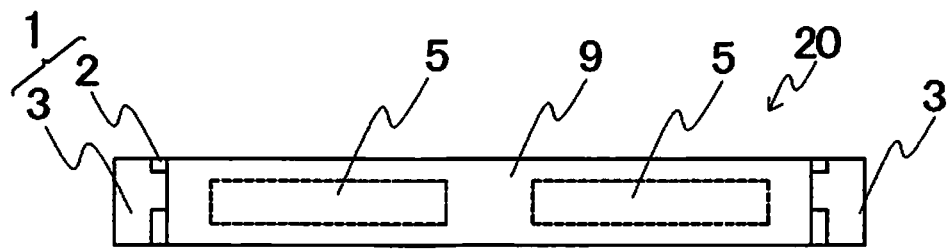
FIGS. 3A to 3D show another embodiment of the light emitting device of the present invention, with FIG. 3A being a simplified front view, FIG. 3B a simplified rear view, FIG. 3C a simplified bottom view, and FIG. 3D a simplified cross sectional view along the A-A' line in FIG. 3A.
Figure 3B:
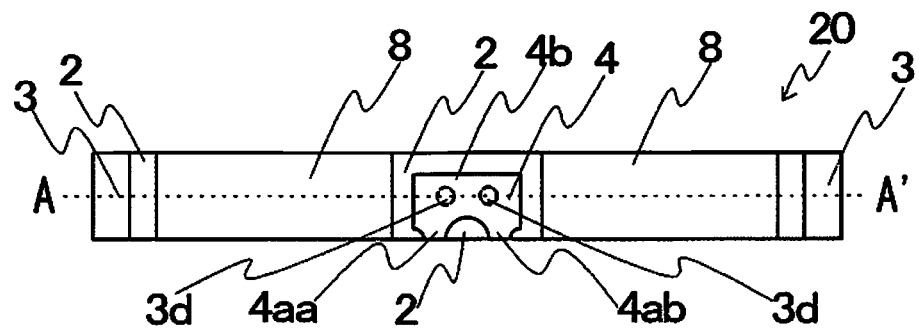
Figure 3C:
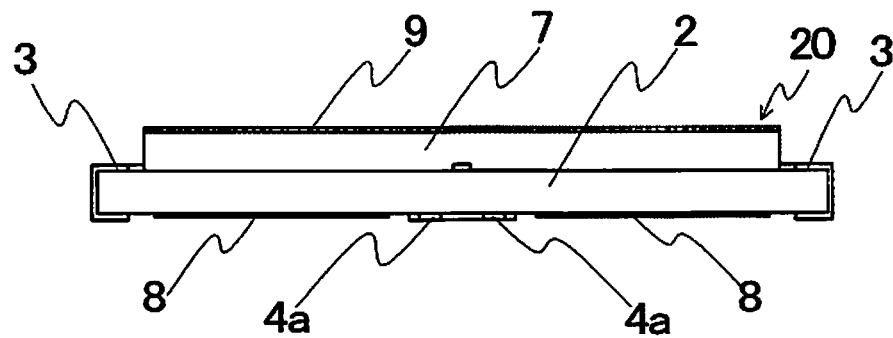
Figure 3D:
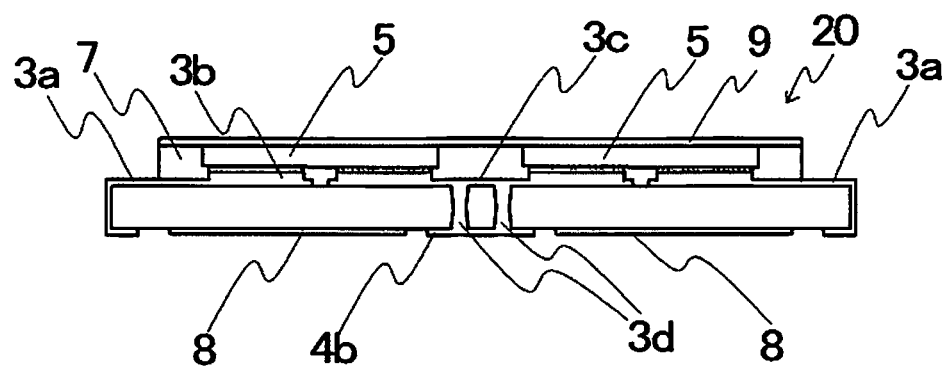
Figure 4:
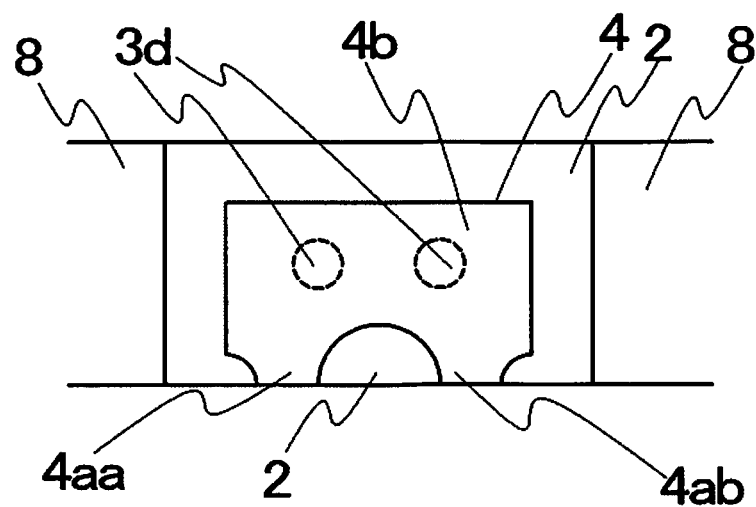
FIG. 4 is a simplified detail view of a portion of the rear face of the light emitting device in FIG. 3B.

As shown in FIGS. 3A, 3B and 4, the two light emitting elements 5 (whose external shape is indicated by broken lines in FIG. 3A) are joined to second connection terminals 3 and one of the pair of element connection sections 3*b* of the pair of connection terminals on the first main surface side of the substrate 1. The second connection terminals 3*c* are provided between the two light emitting elements 5 and between the element connection sections 3*b* of the pair of connection terminals provided opposite each other. The second connection terminals 3 are provided contiguous with the heat dissipation terminal 4 provided on the second main surface side of the substrate 1, through a via 3*d* that passes through the base material 2.

The heat dissipation terminal 4 has two narrow parts 4*aa* and 4*ab*, and a single wide part 4*b* connected to these. The two narrow parts 4*aa* and 4*ab* have a width in the lengthwise direction of the substrate 1 of 0.1 mm at the portion adjacent to the mounting surface, and 0.25 mm at the portion joined to the wide part, and are separated from each other by a spacing of 0.2 mm. The base material 2 is exposed in an approximately semicircular shape in between the two narrow parts 4*aa* and 4*ab*. The wide part 4*b* is substantially rectangular, with a width in the lengthwise direction of the base 1 of 0.5 mm and a height of 0.2 mm. The wide part 4*b* has vias 3*d* that are contiguous with the second connection terminal 3*c*. The external shape of the vias 3*d* are indicated by a broken line in FIG. 3B.

In this embodiment, the film-like solder resists 8 are separated from the heat dissipation terminal 4 and does not cover the heat dissipation terminal 4. The solder resists 8 are provided on the base material 2, with two of them being provided between the heat dissipation terminal 4 and each of the pair of connection terminals 3, respectively.

Otherwise, the configuration here is the same as in Embodiment 1.

Embodiment 3

FIGS. 4 and 5 show the light emitting device 30 in this embodiment.

Figure 5A:
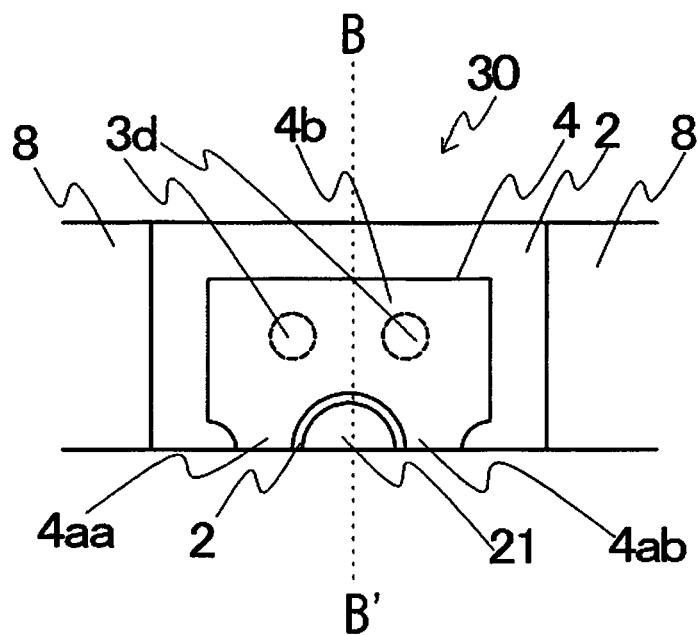
FIGS. 5A to 5B show still another embodiment of the light emitting device of the present invention, with FIG. 5A being a simplified rear view and FIG. 5B a simplified partial cross sectional view along the B-B' line in FIG. 5A.
Figure 5B:
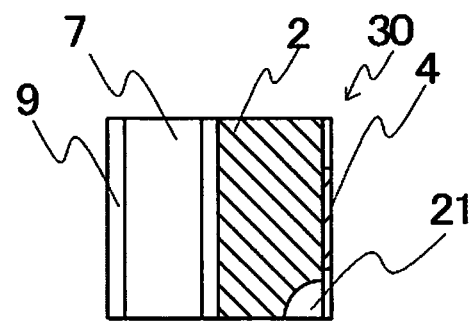

As shown in FIGS. 5A and 5B, the light emitting device 30 in this embodiment has a concave component 21 provided to the base material 2 between the two narrow parts 4*aa* and 4*ab* of the heat dissipation terminal 4. The concave component 21 has an opening on the second main surface side and the mounting surface side of the substrate 1. An insulating member, which is the material of the base material 2, is exposed inside the concave component 21.

Otherwise, the configuration here is substantially the same as in Embodiment 2.

Embodiment 4

Figure 6:
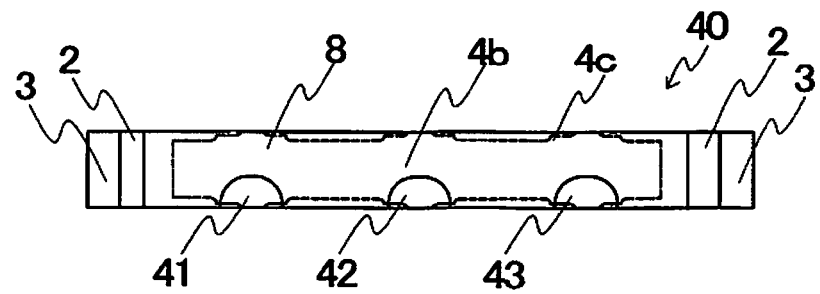
FIG. 6 shows a simplified rear view of still another embodiment of the light emitting device of the present invention.
Figure 7A:
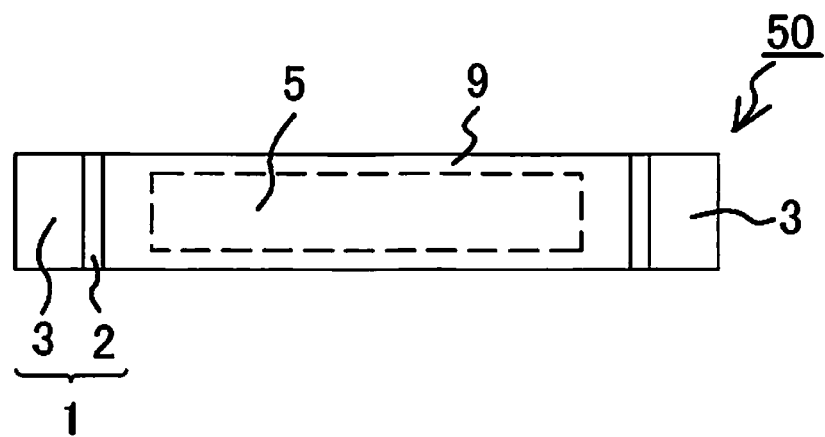
FIGS. 7A to 7D show an embodiment of the light emitting device of the present invention, with FIG. 7A being a simplified front view, FIG. 7B a simplified rear view, FIG. 7C a simplified bottom view, and FIG. 7D a simplified top view.
Figure 7B:
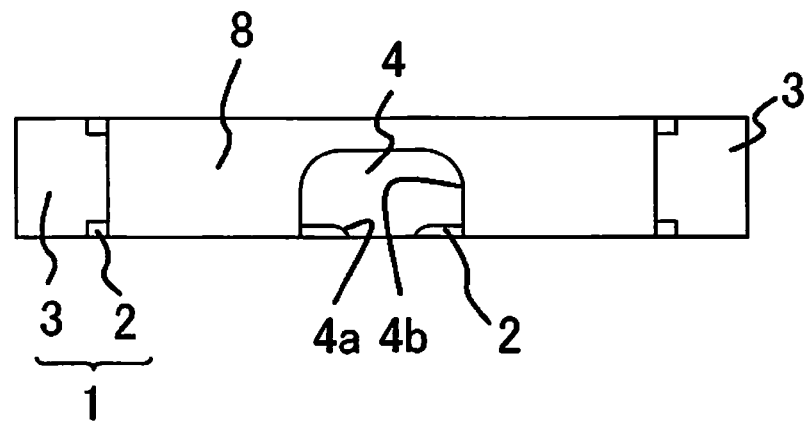
Figure 7C:
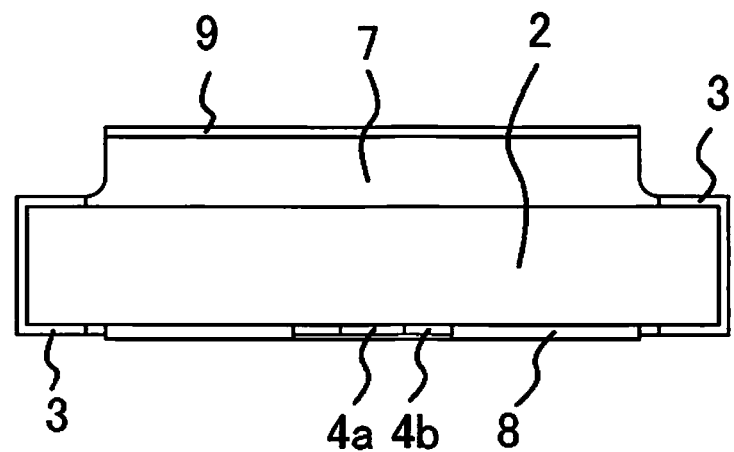
Figure 7D:
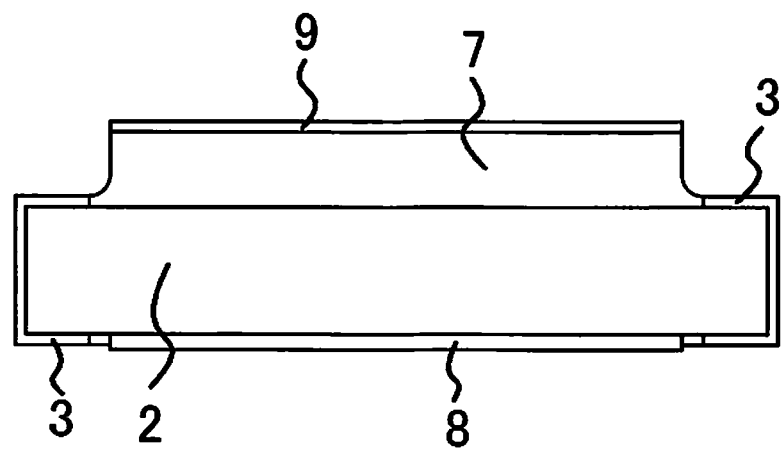

As shown in FIG. 6, the light emitting device 40 in this embodiment has three heat dissipation terminals 41, 42, and 43, which each have narrow parts 4*a* and a wide part 4*b*, and which are provided in line in the lengthwise direction of the substrate 1 and line symmetry with respect to the mounting surface, aligned in the lengthwise direction of the substrate on the second main surface of the substrate 1. Of these three, the middle heat dissipation terminal 42 is provided in the center in the lengthwise direction of the substrate 1. The solder resist 8 covers the covered part 4*c* of the metal part, whose external shape is indicated by a broken line, and exposes the three heat dissipation terminals 41, 42, and 43. Thus providing a plurality of heat dissipation terminals allows good heat dissipation to be ensured in the light emitting device without increasing the height of the heat dissipation terminal 4.

Otherwise, the configuration here is substantially the same as in Embodiment 2.

Embodiment 5

As shown in FIGS. 7A to 7D, the light emitting device 50 in this embodiment has one light emitting element 5. The length of the substrate 1 in the lengthwise direction is set to 1.6 times of the length of the light emitting element 5 in the lengthwise direction. The solder resist 8 is provided on the rear surface of the substrate 1, between a pair of connection terminals 3 and the heat dissipation terminal 4, and over the upper surface to the lower surface of the light emitting device 50. The pair of connection terminals 3 which is exposed from the solder resist 8 have narrow-width regions, respectively. On the upper surface of the light emitting device, the base material 2 is exposed in the shape of rectangle from the regions which is above the narrow-width regions, and on the rear surface of the light emitting device, the base material 2 is exposed in the shape of rectangles from the regions adjacent to the narrow-width regions. The solder resist 8 covers a metal part in an integrated fashion with one of the pair of the connection terminals 3 and this demarcates the shape of the heat dissipation terminal 4. Otherwise, the configuration here is substantially the same as in Embodiment 1.

The light emitting device 50 has the same effects as the light emitting devices in Embodiments 1 to 4.

Embodiment 6

As shown in FIGS. 8A to 8E, the light emitting devices 60A to 60E in this embodiment have substantially the same configuration as the light emitting device 50 in Embodiment 5, except that the shape of the heat dissipation terminal 4 is different from that of the light emitting device 50 in Embodiment 5.

Figure 8A:
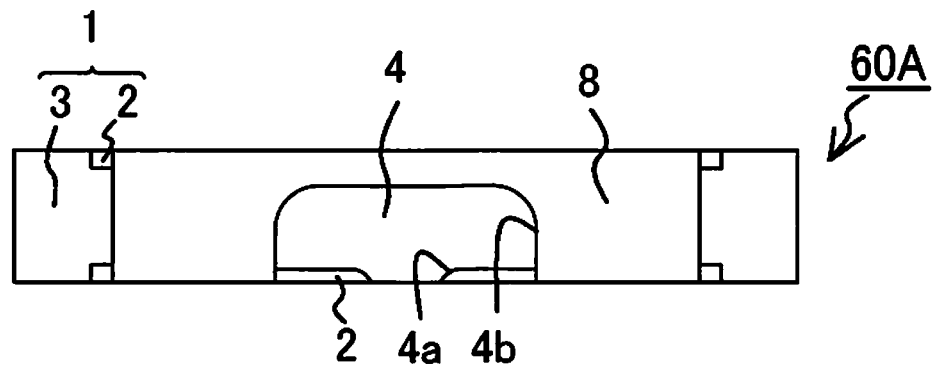
FIGS. 8A to 8E are simplified detail views of modification examples of the heat dissipation terminal on the rear face of the light emitting device of the present invention.

In the heat dissipation terminal 4 of the light emitting device 60A as shown in FIG. 8A, the width of the wide part 4*b* is set 0.3 times of the substrate 1.

Figure 8B:
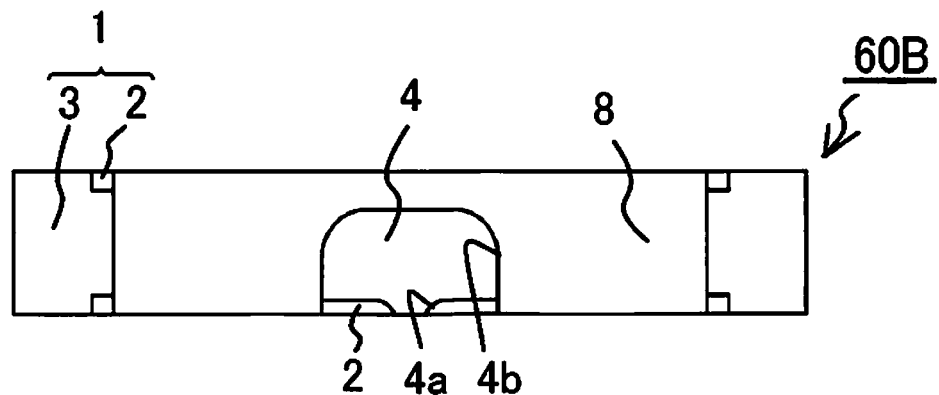

In the heat dissipation terminal 4 of the light emitting device 60B as shown in FIG. 8B, the width of the narrow part 4*a* is set 0.15 times of the wide part 4*b*.

Figure 8C:
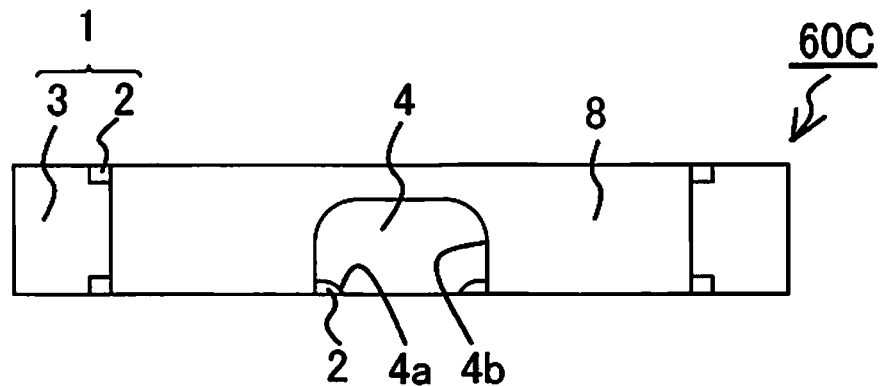

In the heat dissipation terminal 4 of the light emitting device 60C as shown in FIG. 8C, the width of the narrow part 4*a* is set 0.7 times of the wide part 4*b*.

Figure 8D:
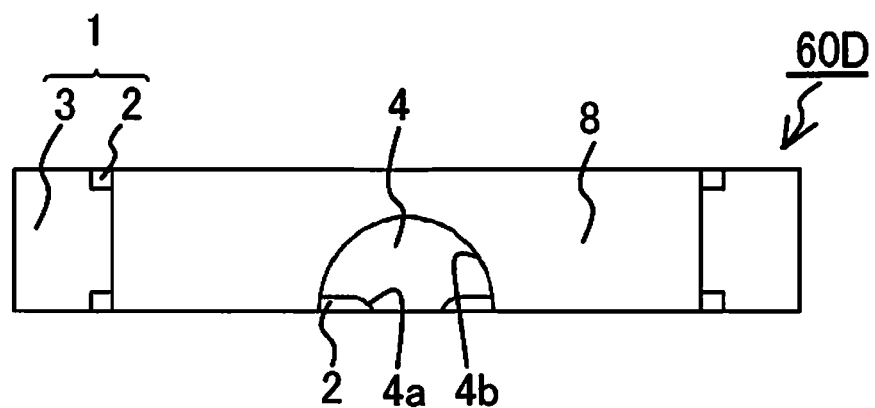

In the heat dissipation terminal 4 of the light emitting device 60D as shown in FIG. 8D, the width of the wide part 4*b* is substantially in a semicircular shape.

Figure 8E:
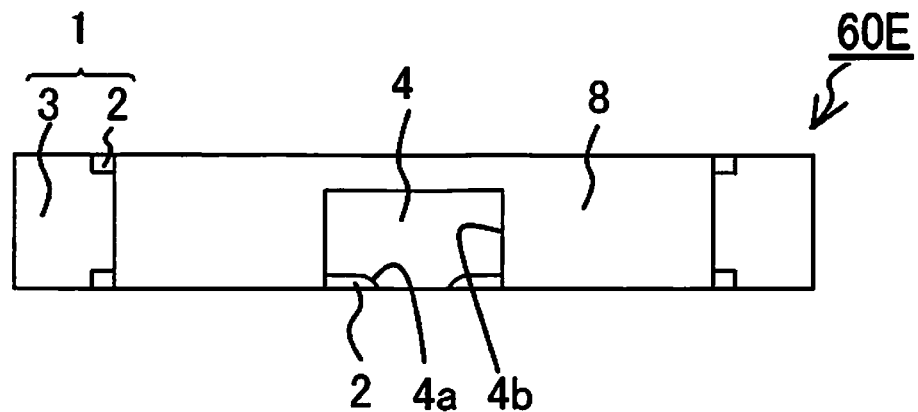

In the heat dissipation terminal 4 of the light emitting device 60E as shown in FIG. 8E, the width of the wide part 4*b* is substantially in a rectangle shape.

Embodiment 7

Figure 9:
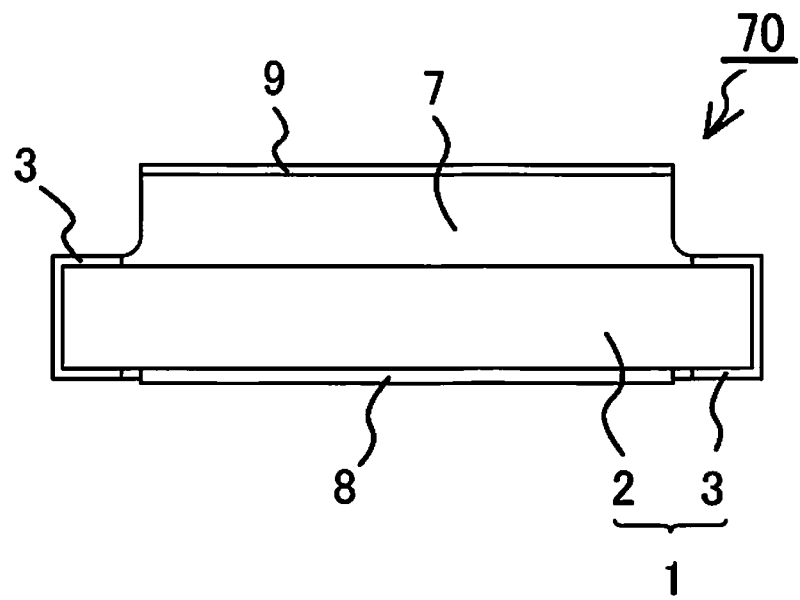
FIG. 9 is a simplified top view of another modification example of the light emitting device of the present invention.

As shown in FIG. 9, the light emitting device 70 in this embodiment has substantially the same configuration as the light emitting device 50 in Embodiment 5, except that the thickness of the base material 2 is the same as that of the sealing member 7.

Embodiment 8

Figure 10:
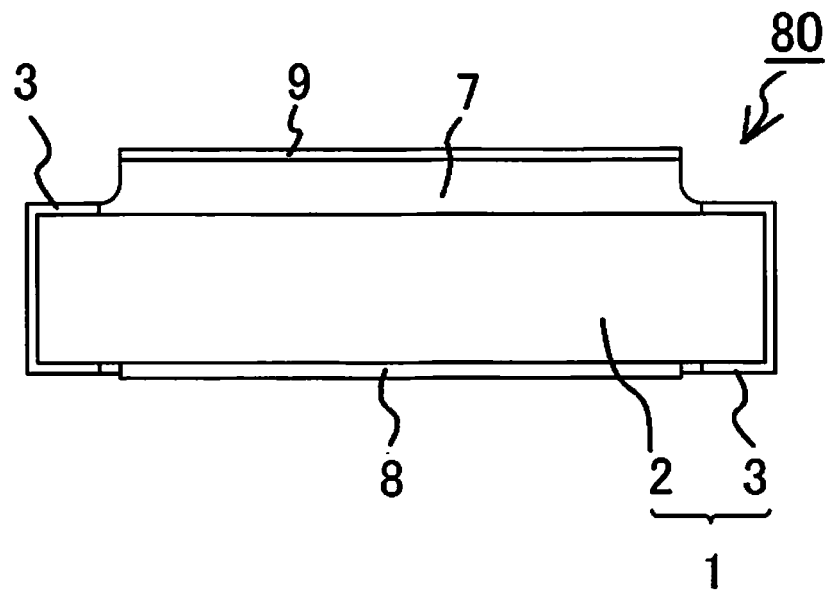
FIG. 10 is a simplified top view of still another modification example of the light emitting device of the present invention.

As shown in FIG. 10, the light emitting device 80 in this embodiment has substantially the same configuration as the light emitting device 50 in Embodiment 5, except that the thickness of the base material 2 is set 2.7 times of that of the sealing member 7.

Embodiment 9

Figure 11:
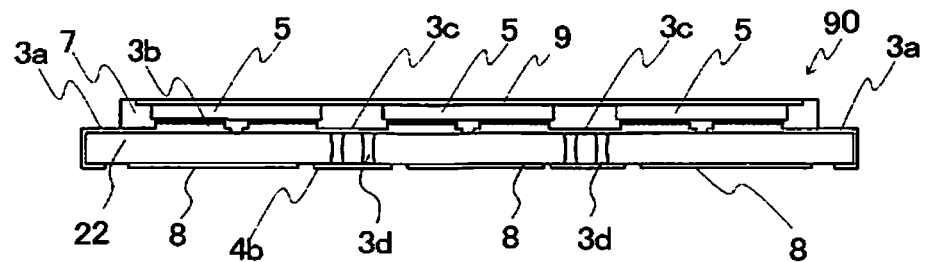
FIG. 11 is a simplified cross sectional view of still another modification example of the light emitting device of the present invention.

As shown in FIG. 11, the light emitting device 90 is provided three light emitting elements 5, and two connection terminals 3c between the light emitting elements. The connection terminals 3c connects to the heat dissipation terminals 4b, respectively through the vias 3d. The length of the lengthwise direction of the base material 22 is set 4.5 times of the length of the lengthwise direction of the light emitting element 5. The side surfaces of the light transmissive member 19 are covered with the sealing member 7.

Otherwise, the configuration here is substantially the same as the light emitting device 20 in Embodiment 2.

Embodiment 10

Figure 12:
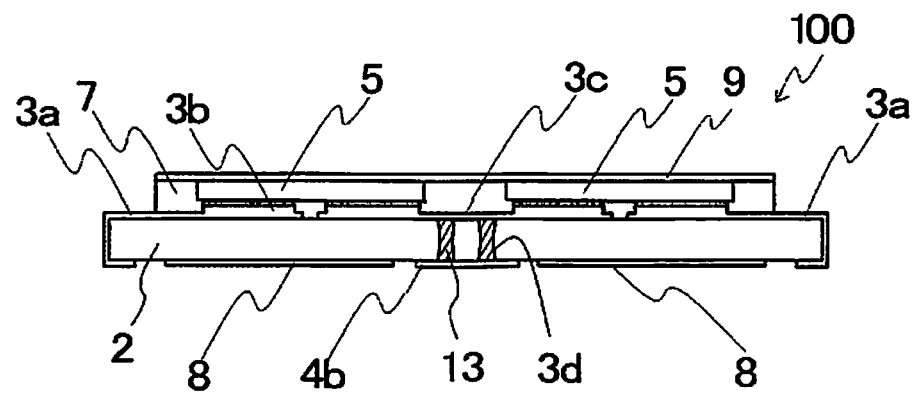
FIG. 12 is a simplified cross sectional view of still another modification example of the light emitting device of the present invention.

As shown in FIG. 12, the light emitting device 100 in this embodiment has substantially the same configuration as the light emitting device 50 in Embodiment 5, except that the vias 3d penetrating the substrate are formed by being filled with a conductive resin including a resin and a conductive material.

Embodiment 11

Figure 13A:
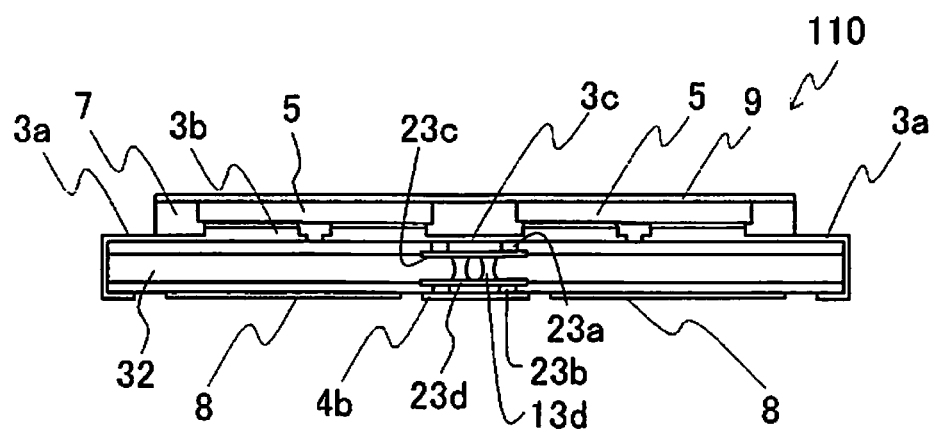
FIG. 13A is a simplified cross sectional view of still another modification example of the light emitting device of the present invention.
Figure 13B:
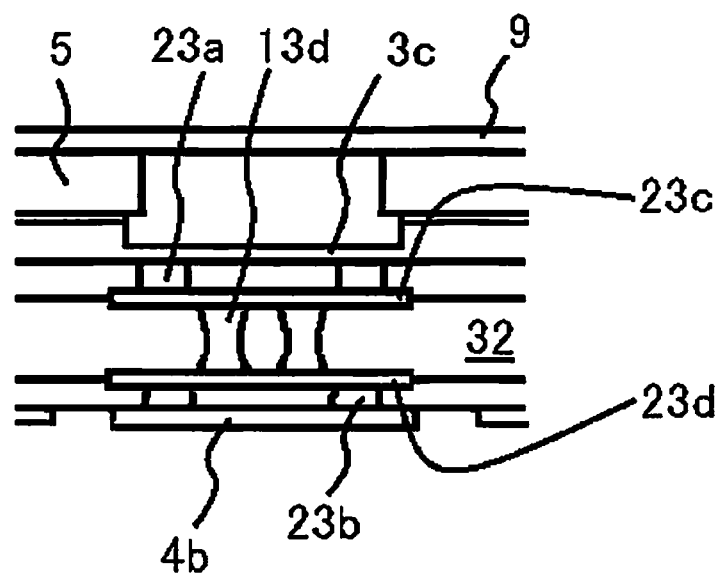
FIG. 13B is a simplified detail view of a portion of the light emitting device in FIG. 13A.

As shown in FIGS. 13A, 13B, the light emitting device 110 is provided a base material 32 in which a first layer, second layer and third layer are laminated in that order from the mounting surface of the light emitting element. Vias 23a penetrating the first layer, vias 13d penetrating the second layer and a via 23b penetrating third layer are provided. A wiring layer 23c is provided between the first layer and the second layer, and connects to the vias 23a and the vias 13d. A wiring layer 23d is provided between the second layer and the third layer, and connects to the vias 13d and the vias 23b. The second connection terminal 3c is connects to the wide part 4b of the heat dissipation terminal 4 through the vias 23a, 13d and 23b, and the wiring layer 23c and 23d.

Otherwise, the configuration here is substantially the same as the light emitting device 20 in Embodiment 2.

Embodiment 12

Figure 14:
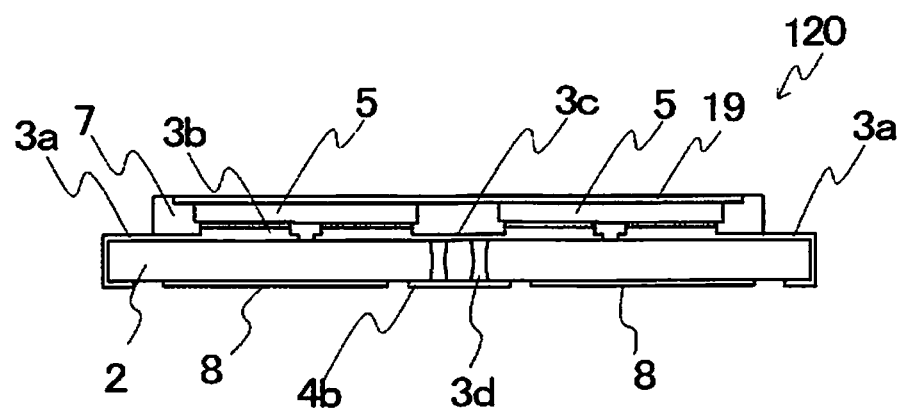
FIG. 14 is a simplified cross sectional view of still another modification example of the light emitting device of the present invention.

As shown in FIG. 14, the light emitting device 120 in this embodiment has substantially the same configuration as the light emitting device 20 in Embodiment 2, except that the side surfaces of the light transmissive member 19 is covered with the sealing member 7.

The light emitting device of the present invention can be used for backlight light sources of liquid crystal displays, various kinds of lighting fixtures, and various kinds of display devices such as large displays, advertisements and destination guides, and image reading devices in digital video cameras, facsimiles, copiers, scanners and the like, and projector devices.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
   a substrate having a first main surface,
      a second main surface that is opposite the first main surface, and
      a mounting surface that is adjacent to at least the second main surface, and
      that includes
      an insulating base material,
      a pair of connection terminals disposed on the second main surface, and
      a plurality of heat dissipation terminals disposed between the pair of connection terminals,
   a light emitting element that is mounted on the first main surface of the substrate in flip-chip manner, and
   a light blocking sealing member that seals the light emitting element and is formed substantially in the same plane as the substrate on the mounting surface.

2. The light emitting device according to claim 1, further comprising
   an additional light emitting element.

3. The light emitting device according to claim 2, wherein the heat dissipation terminals are respectively disposed at
   a position between the light emitting element and the additional light emitting element and at positions corresponding to the light emitting element and the additional light emitting element on a second main surface side.

4. The light emitting device according to claim 3, wherein each of the heat dissipation terminals includes a concave component.

5. The light emitting device according to claim 4, wherein a base member of the substrate is partially exposed on the second main surface of the substrate.

6. The light emitting device according to claim 5, wherein each of the heat dissipation terminals includes an edge extending generally along a straight line.

7. The light emitting device according to claim 1, wherein each of the heat dissipation terminals includes a concave component.

8. The light emitting device according to claim 1, wherein each of the heat dissipation terminals includes a narrow part.

9. The light emitting device according to claim 1, wherein each of the heat dissipation terminals includes a plurality of narrow parts and a concave component disposed between the narrow parts.

10. The light emitting device according to claim 1, further comprising
    a solder resist disposed on the second main surface of the substrate.

11. The light emitting device according to claim 10, wherein
    the solder resist defines a shape of each of the heat dissipation terminals.

12. The light emitting device according to claim 10, wherein
    at least one of the heat dissipation terminals is defined as an exposed part of a metal film disposed on the second main surface of the substrate with the metal film being partially covered by the solder resist.

13. The light emitting device according to claim 1, wherein
the substrate has an elongated shape in a plan view.

14. The light emitting device according to claim 1, further comprising
an additional light emitting element,
each of the light emitting element and the additional light emitting element having an elongated shape, and the light emitting element and the additional light emitting element being aligned along a longitudinal direction of the substrate.

15. The light emitting device according to claim 14, wherein
the heat dissipation terminals are disposed on the second main surface of the substrate respectively at a position between the light emitting element and the additional light emitting element and at positions corresponding to the light emitting element and the additional light emitting element.

16. The light emitting device according to claim 1, wherein
a height of the heat dissipation terminals is shorter than a height of the connection terminals.

17. The light emitting device according to claim 1, wherein
the insulating base material is partially exposed on the second main surface of the substrate.

18. The light emitting device according to claim 1, wherein
each of the heat dissipation terminals includes an edge extending generally along a straight line.

19. The light emitting device according to claim 1, wherein
the connection terminals are respectively disposed at end portions of the substrate on the second main surface.

20. The light emitting device according to claim 1, wherein
at least one of the heat dissipation terminals extends to the first main surface of the substrate with a via.

21. The light emitting device according to claim 1, wherein
the light emitting element has a rectangular shape in a plan view with a length of a long side to a length of a short side being in a range about 2:1 to 50:1.

* * * * *